US010353040B2

(12) United States Patent
Parrish et al.

(10) Patent No.: US 10,353,040 B2
(45) Date of Patent: Jul. 16, 2019

(54) SYSTEM AND METHOD FOR ACQUIRING BOTH T2*-WEIGHTED AND T1-WEIGHTED DATA IN A SINGLE ACQUISITION USING A SINGLE DOSE OF CONTRAST AGENT

(71) Applicant: Northwestern University, Evanston, IL (US)

(72) Inventors: Todd Parrish, Evanston, IL (US); Yu Fen Chen, Chicago, IL (US)

(73) Assignee: Northwestern University, Evanston, IL (US)

( * ) Notice: Subject to any disclaimer, the term of this patent is extended or adjusted under 35 U.S.C. 154(b) by 78 days.

(21) Appl. No.: 15/785,343

(22) Filed: Oct. 16, 2017

(65) Prior Publication Data

US 2018/0038933 A1 Feb. 8, 2018

Related U.S. Application Data

(63) Continuation-in-part of application No. 15/101,166, filed as application No. PCT/US2013/072607 on Dec. 2, 2013.

(Continued)

(51) Int. Cl.
*G01V 3/00* (2006.01)
*G01R 33/563* (2006.01)
(Continued)

(52) U.S. Cl.
CPC ....... *G01R 33/56366* (2013.01); *G01R 33/50* (2013.01); *G01R 33/5601* (2013.01); *G01R 33/5602* (2013.01)

(58) Field of Classification Search
CPC ...... G01R 33/307; G01R 33/34; G01R 33/36; G01R 33/3607; G01R 33/3614;
(Continued)

(56) References Cited

U.S. PATENT DOCUMENTS 5,685,305 A  11/1997  Moonen et al.
6,754,521 B2  6/2004  Prince
(Continued)

FOREIGN PATENT DOCUMENTS

WO  2008147921 A1  12/2008

OTHER PUBLICATIONS

Sladky, et al., Slice-Timing Effects and Their Correction in Functional MRI, NeuroImage, 2011, 58:588-594.
(Continued)

*Primary Examiner* — Giovanni Astacio-Oquendo
*Assistant Examiner* — Raul J Rios Russo
(74) *Attorney, Agent, or Firm* — Quarles & Brady LLP

(57) ABSTRACT

Described here are systems and methods for obtaining measurements of both tissue perfusion and permeability with a magnetic resonance imaging ("MRI") system after the administration of a single dose of contrast agent. To this end, the MRI system is directed to acquire T2-weighted or T2*-weighted data, during which the acquired signal values are monitored for a trigger event. When the trigger event occurs, the MRI system is directed to switch from acquiring the T2-weighted or T2*-weighted data to acquiring T1-weighted data. The systems and methods described here can thus be used for a fully automated, single acquisition of perfusion and permeability measurements using only a single dose of contrast agent.

23 Claims, 4 Drawing Sheets

Related U.S. Application Data

(60) Provisional application No. 62/489,108, filed on Apr. 24, 2017, provisional application No. 62/408,409, filed on Oct. 14, 2016.

(51) Int. Cl.
*G01R 33/50* (2006.01)
*G01R 33/56* (2006.01)

(58) Field of Classification Search
CPC ............ G01R 33/3621; G01R 33/3628; G01R 33/3635; G01R 33/3642; G01R 33/365; G01R 33/3657; G01R 33/3664; G01R 33/3671; G01R 33/3678; G01R 33/3685
USPC .................................................. 324/300–322
See application file for complete search history.

(56) References Cited

U.S. PATENT DOCUMENTS

| | | |
|---|---|---|
| 6,804,546 B1 | 10/2004 | Thompson et al. |
| 7,639,010 B2 | 12/2009 | Park |
| 7,705,597 B2 | 4/2010 | Horger et al. |
| 2004/0210130 A1* | 10/2004 | Prince .................... A61B 5/411 600/420 |
| 2013/0123611 A1* | 5/2013 | Riederer ............ G01R 33/4818 600/419 |
| 2016/0270687 A1* | 9/2016 | Brady-Kalnay ....... A61B 5/055 |

OTHER PUBLICATIONS

PCT International Search Report and Written Opinion, PCT/US2013/0072607, dated Apr. 15, 2014.

\* cited by examiner

SYSTEM AND METHOD FOR ACQUIRING BOTH T2*-WEIGHTED AND T1-WEIGHTED DATA IN A SINGLE ACQUISITION USING A SINGLE DOSE OF CONTRAST AGENT

CROSS-REFERENCE TO RELATED APPLICATIONS

This application is a continuation-in-part of U.S. patent application Ser. No. 15/101,166 filed Jun. 2, 2016 which claims benefit of International Patent Application PCT/US2013/072607 filed Dec. 2, 2013, both entitled "SYSTEM AND METHOD FOR ACQUIRING BOTH T2*-WEIGHTED AND T1-WEIGHTED DATA IN A SINGLE ACQUISITION USING A SINGLE DOSE OF CONTRAST AGENT", all of which are herein incorporated by reference in their entirety.

This application also claims the benefit of U.S. Provisional Patent Application Ser. No. 62/489,108, filed on Apr. 24, 2017, and entitled "SYSTEM AND METHOD FOR ACQUIRING BOTH T2*-WEIGHTED AND T1-WEIGHTED DATA IN A SINGLE ACQUISITION USING A SINGLE DOSE OF CONTRAST AGENT," and U.S. Provisional Patent Application Ser. No. 62/408,409, filed on Oct. 14, 2016, and entitled "SYSTEM AND METHOD FOR ACQUIRING BOTH T2*-WEIGHTED AND T1-WEIGHTED DATA IN A SINGLE ACQUISITION USING A SINGLE DOSE OF CONTRAST AGENT," all of which are herein incorporated by reference in their entirety.

BACKGROUND

Advanced magnetic resonance imaging ("MRI") techniques such as dynamic susceptibility contrast ("DSC") imaging and dynamic contrast enhanced ("DCE") imaging have shown promise as noninvasive methods for assessing tumor physiology, which was previously only available through surgical biopsies. DSC-MRI provides several perfusion-based parameters, such as cerebral blood volume ("CBV"), cerebral blood flow ("CBF"), and mean transit time ("MTT"), to represent hemodynamics and vascularity of the imaged tissues. This information is thought to correlate with tumor aggressiveness based on the importance of vascular proliferation in malignancy. In particular, relative CBV—a ratio of tumor CBV to normal white matter CBV—has shown diagnostic reliability in glioma grading. Despite its proven utility, DSC-MRI is subject to susceptibility artifacts because it measures $T_2$ or $T^*_2$ changes, making it difficult to assess tumors in close proximity to bone or large vessels. Also, DSC-MRI calculations assume an intact blood-brain barrier, which is often not the case in aggressive tumors.

DCE-MRI provides permeability based parameters such as the volume transfer constant, $K_{trans}$, and plasma volume, $V_p$, to describe neovascularity and angiogensis in the imaged tissues. Recent work has supported the ability of DCE-MRI parameters, particularly $K_{trans}$, in differentiating high grade and low grade gliomas. Other studies have indicated that DCE-MRI may be valuable in detecting anti-angiogenic treatment response and differentiating radiation injury from tumor recurrence. Furthermore, being a T1-weighted gradient-recalled echo ("GRE") technique, DCE-MRI has several advantages over DSC-MRI, such as insensitivity to susceptibility artifacts, higher spatial resolution, and improved signal-to-noise ratio ("SNR").

Recent studies have suggested that the clinical utility of DSC-MRI and DCE-MRI in tumor diagnosis and prognosis is increased when perfusion and permeability parameters are considered in combination. However, DSC-MRI and DCE-MRI scans are typically performed as separate procedures, each with its own contrast injection. Due to logistical, financial, and patient safety concerns related to contrast exposure, physicians are often unable to perform both types of scans for a given patient.

Because DSC-MRI and DCE-MRI parameters are derived from two separate phases of the same process (i.e., contrast evolution through tissue), we propose a novel, combinatorial technique to collect both DSC-MRI and DCE-MRI data in a single scan session using a single contrast injection. The method monitors the acquisition of the DSC-MRI data collection and automatically detects when the first pass of the contrast agent is completed. It then switches to the DCE-MRI data collection without any user intervention.

SUMMARY OF THE DISCLOSURE

The present disclosure overcomes the aforementioned drawbacks by providing a method for directing a magnetic resonance imaging ("MRI") system to acquire both T2-weighted data, which may be T2*-weighted data, and T1-weighted data from a subject in which a single dose of contrast agent is present. The method includes administering a dose of a contrast agent to the subject, or imaging a subject to which a dose of contrast agent has already been administered. The MRI system is directed to acquire T2-weighted data from the subject while the dose of contrast agent is present in the subject, for example during the first pass of the contrast agent. Signal values in the T2-weighted data are monitored for a trigger event while the MRI system is acquiring the T2-weighted data. When the trigger event is detected, the MRI system is then directed to acquire T1-weighted data from the subject while the dose of contrast agent is present in the subject by switching from a T2-weighted pulse sequence to a T1-weighted pulse sequence when the trigger event occurs.

The trigger event may include monitoring the signal values for a peak negative signal value and then monitoring the signal values for a recovery to a stable signal value, which may be the baseline value, whereby when the recovery to the stable signal value occurs the MRI system switches from the T2-weighted pulse sequence to the T1-weighted pulse sequence.

The trigger event may also include monitoring the signal values for a peak negative signal value, then monitoring the signal values for a recovery to a percent of a baseline signal value, and then waiting a delay time after the recovery to the percent of the baseline is detected, whereby the MRI system switches from the T2-weighted pulse sequence to the T1-weighted pulse sequence after the delay time. The delay time may be in a range of about 3-9 seconds.

The trigger event may also include monitoring the signal values for a peak negative signal value and then waiting a delay time after the peak negative value is detected, whereby the MRI system switches from the T2-weighted pulse sequence to the T1-weighted pulse sequence after the delay time. The time it takes the signal values to decrease from baseline to the peak negative value can be measured, and the delay time can be set as twice this time. The delay time may also be in a range of about 7-15 seconds.

The trigger event may also include monitoring the signal values for a percent decrease from a baseline signal value and then waiting a delay time after the percent decrease from the baseline signal value is detected, whereby the MRI system switches from the T2-weighted pulse sequence to the T1-weighted pulse sequence after the delay time. The delay time may be in a range of about 12-25 seconds.

Monitoring the signal values for the trigger event may include monitoring signal values in a selected region-of-interest ("ROI"). The ROI can be a slice location within an image volume from which the T2-weighted data is acquired. The ROI can also be a subset of a slice location within an image volume from which the T2-weighted data is acquired. The ROI can also be a subvolume of an image volume from which the T2-weighted data is acquired. The ROI can also be the entire image volume from which the T2-weighted data is acquired. The ROI can also be located outside of an image volume from which the T2-weighted data is acquired and the monitoring step can include acquiring additional T2-weighted data from the region-of-interest.

It is another aspect of the present disclosure to compute perfusion parameters from the T2-weighted data.

It is still another aspect of the present disclosure to provide baseline T1-weighted data acquired from the subject and to compute tissue permeability measurements from the baseline T1-weighted data and the acquired T1-weighted data. Providing the baseline T1-weighted data may include acquiring the baseline T1-weighted data before the contrast agent is administered to the subject.

It is still another aspect of the present disclosure that the T2-weighted data can be acquired at a first temporal resolution and the T1-weighted data can be acquired at a second temporal resolution that is lower than the first temporal resolution. A first arterial input function ("AIF") can be computed from the T2-weighted data and a second AIF can be computed from the T1-weighted data. The second AIF can be corrected based on the first AIF. In one example, the second AIF can be fit to the first AIF to perform this correction. In another example, the T1-weighted data can be temporally shifted, or interpolated, based on a signal peak in the first AIF, and the second AIF can be computed from this temporally shifted data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is made therefore to the claims and herein for interpreting the scope of the invention.

DETAILED DESCRIPTION

Described here are systems and methods for obtaining measurements of both tissue perfusion and permeability with a magnetic resonance imaging ("MRI") system after the administration of a single dose of contrast agent. To this end, the systems and methods described here include the acquisition of a first data type, such as perfusion-weighted data, during which the acquired magnetic resonance signals are monitored for a trigger event. When the trigger event occurs, the MRI system is directed to switch from acquiring the first data type to a second data type, such as T1-weighted image data. The systems and methods described in the present disclosure can advantageously be used for a fully automated, single acquisition of perfusion and permeability measurements using only a single dose of contrast agent.

The systems and methods described here thus allow the automatic collection of both perfusion-weighted data and data from which permeability measurements can be computed using only a single full dose of contrast. The imaging setup can include the placement of region-of-interest ("ROI") inside, or outside, of the target anatomy. Placement of the ROI can be done manually or automatically. This ROI is monitored for the trigger event that will switch the MRI system between the two data acquisition schemes. The resulting data can be processed with standard perfusion software to compute perfusion measurements, and can also be processed to calculate permeability measures.

In some embodiments, the ROI can be positioned within the target anatomy for which the perfusion and permeability measurements are desired. As an example, the ROI can be a single slice location in the target anatomy or a subset of that slice location. As another example, the ROI can be a volume-of-interest that covers the whole target anatomy or a subset thereof. For instance, the target anatomy can be the brain and the ROI can be positioned within a location in the brain; however, other anatomical targets can also be imaged with these techniques, including the breast, liver, prostate, and so on.

In some embodiments, the ROI can be positioned outside of the target anatomy for which the perfusion and permeability measurements are desired. As an example, the ROI can be a single slice location outside of the target anatomy, or a subset of that slice location outside of the target anatomy. For instance, the target anatomy can be the brain and the ROI can a slice location, or subset thereof, that covers the carotid artery.

Figure 1:
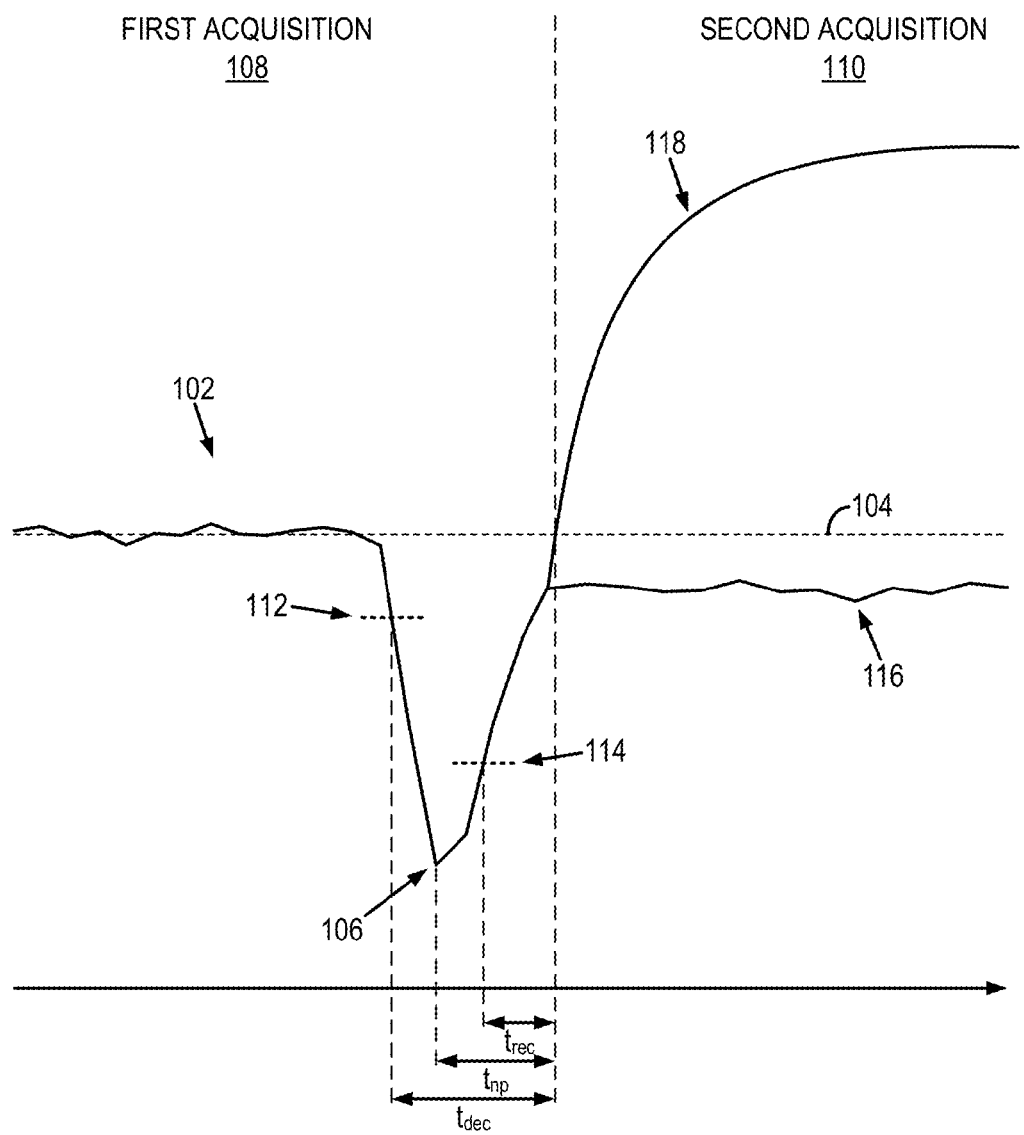
FIG. 1 illustrates an example of a magnetic resonance signal intensity curve following the administration of a contrast agent to a subject.

Referring now to FIG. 1, an example of the signal intensity evolution following the administration of a single dose of contrast agent is illustrated. In this example, the signal 102 starts around a baseline level 104. After a period of time, the signal 102 begins to decrease towards a peak negative value 106, after which the signal 102 generally recovers back to a stable signal level 116, which may or may not be the baseline signal value 104. In general, the signal 102 plateaus and fluctuates around the stable signal value 116 as a result of recirculation of the contrast agent. In some instances, the stable signal value 116 may be the same as the baseline signal value 104. In some regions, however, significant T1-enhancement will occur, resulting in a T1-enhanced signal 118 in those regions. As will be described below with several non-limiting examples, the trigger event that switches the MRI system between data acquisition schemes is based on monitoring this signal 102.

In some embodiments, the trigger can be measuring a return to a stable signal level 116 after the peak negative value 106 occurs. For instance, the MRI system can monitor for the occurrence of the peak negative value 106. When this value occurs, the MRI system switches to monitoring for a recovery to the stable signal value 116. When recovery to the stable value 116 is reached, the MRI system will transition from the first acquisition 108 to the second acquisition 110. In some instances, the trigger can be made if the signal goes above the baseline value 104 following the peak signal loss, which indicates a high level of leakage. Preferably, recovery to the stable signal value 116 is monitored in a larger region-of-interest, such as a whole slice or a whole volume. Using a larger region-of-interest for monitoring diminishes the potential for local T1-enhancement signals 118 to obfuscate the stable signal value 116.

The trigger event just mentioned is preferable because it is not dependent on selecting a delay time that may be different based on the particular subject. For instance, if the subject is a stroke patient, the time delays might be longer due to the lack of blood flow. If the subject is a tumor patient, however, the time delays might be shorter because the blood flow may be normal or increased, especially in higher grade tumors.

As one example, the trigger can be identified based on monitoring the signal level 116 for certain events. First, a contrast start time point is identified as when the signal starts to drop due to contrast arrival in first bolus passage. This start time point can be defined as when the signal change (e.g., derivative) is lower than the mean baseline derivative. As one example, the start time point, $t_{start}$, can be defined as when the signal change is lower than three standard deviations of the baseline derivative. Second, a point of minimum signal, $t_{min}$, can be identified as when the derivative of the signal first turns positive after the contrast start time point. The trigger can then be identified using one of two conditions to ensure that the DSC acquisition stops with sufficient time to allow the DCE acquisition to acquire data during the initial portion of the uptake curve. The first such condition is when the derivative of the signals is within one standard deviation of the baseline mean derivative (i.e., when the rise in the signal slows). The second such condition is when the duration of the DSC acquisition exceeds the minimum signal time point by $3*(t_{min}-t_{start})$.

In some embodiments, the trigger can be a preset time delay, $t_{np}$, from the detection of the peak negative signal 106. For instance the time delay, $t_{np}$, can be twice the time it takes the signal to change from baseline 104 to that peak negative value 106. As an example, if it takes 10 seconds for the signal to change from baseline 104 to the peak negative value 106, the time delay, $t_{np}$, would be set as 20 seconds starting from the occurrence of the peak negative signal 106. Using this parameter as the trigger can provide for rapid image reconstruction, making it robust for general clinical MRI systems. The delay time, $t_{np}$, can also be set as a delay time on the order of 7.5-10 seconds in tumor patients and 10-15 seconds for stroke patients.

In some embodiments, the trigger can be a preset time delay, $t_{dec}$, from the detection of a specific relative decrease from the baseline signal value 104. For instance, the MRI system can monitor for a certain percentage decrease 112 in signal from the baseline signal value 104. As an example, the percentage decrease can be 30 percent. In this instance, the time delay, $t_{dec}$, may be on the order of 12-15 seconds in tumor patients and 20-25 seconds for stroke patients.

In some embodiments, the trigger can be a preset time delay, $t_{rec}$, from the detection of a specific relative recovery from the peak negative signal value 106. For instance, the MRI system can monitor for a certain percentage of signal recovery 114 to baseline 104 from the peak negative value 106. As an example, the MRI system may monitor for the occurrence of the peak negative signal value 106. After the peak negative signal value 106 occurs, the MRI system may then monitor for a certain percentage of recovery 114 back to baseline 104. As an example, the percentage of recovery can be 50 percent. In this instance, the time delay, $t_{rec}$, may be on the order of 3-4.5 seconds in tumor patients and 7-9 seconds for stroke patients. As the trigger point moves closer to a complete recovery to baseline 104, the predictability of the delay time, $t_{rec}$, increases. As a trade-off, however, as the trigger point moves closer to the end of the signal recovery curve the likelihood of missing potential data to be acquired increases. This drawback is not too severe, however, since the likelihood of missing a significant amount of potential data to acquire is low.

Figure 2:
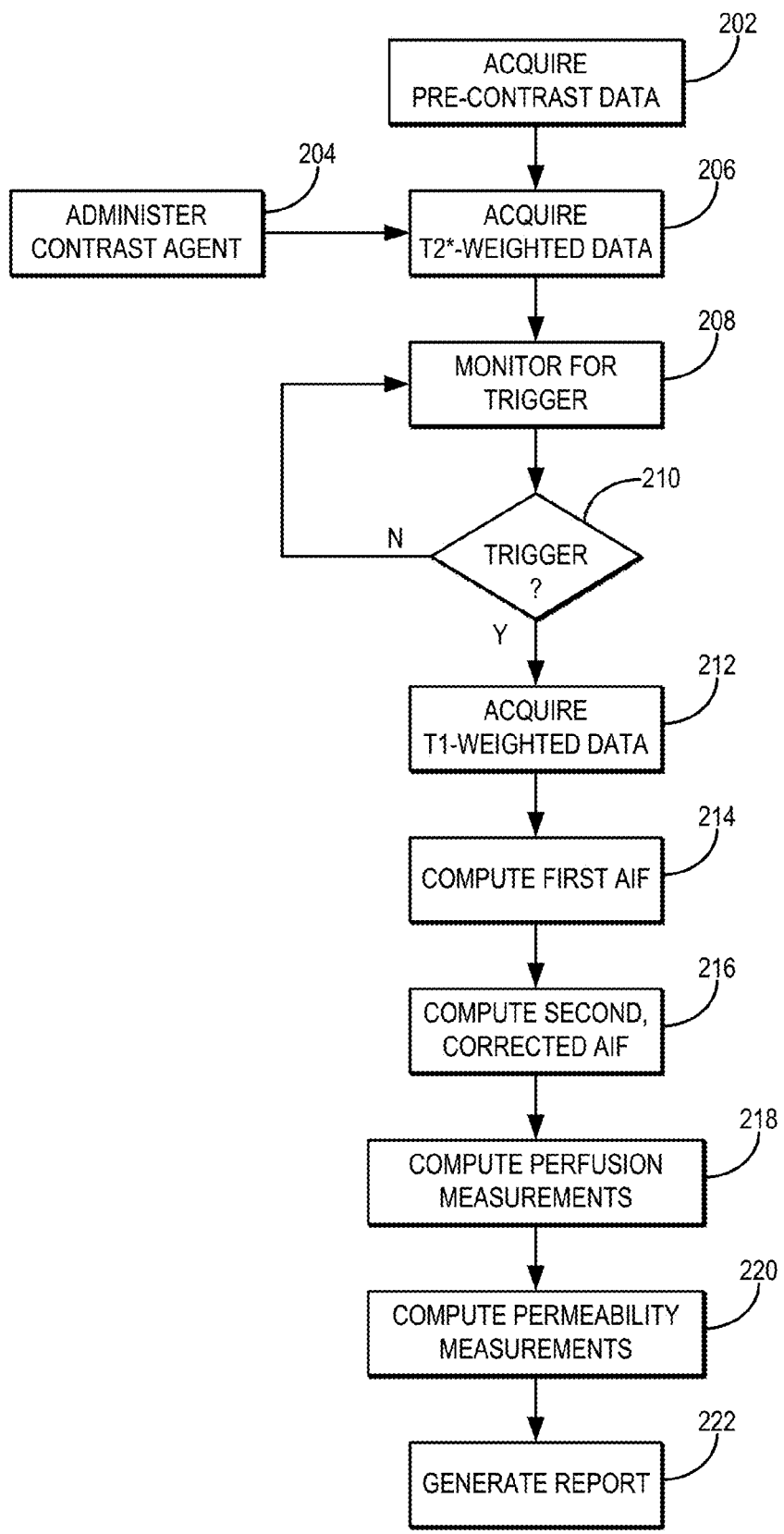
FIG. 2 is a flowchart setting forth the steps of an example of a method that is capable of acquiring both T2*-weighted and T1-weighted data in a single acquisition using a single dose of contrast agent.

Referring now to FIG. 2, a flowchart setting forth the steps of an example of a method for acquiring both perfusion data and permeability data with an MRI system and using a single dose of contrast agent is illustrated. The method begins with providing baseline data acquired from the subject without contrast, as indicated at step 202. For instance, the baseline data can be acquired from the subject with the MRI system prior to the subsequent imaging steps. As an example, the baseline data can be obtained using a T1-weighted imaging sequence, such as a spoiled gradient ("SPGR") pulse sequence, and may be a two-dimensional or, preferably, a three-dimensional acquisition.

The method proceeds with the administration of a contrast agent to the subject, as indicated at step 204. Preferably, only a single dose of contrast agent is administered to the subject. This is in contrast to other methods, where a separate dose of contrast agent is administered for each different imaging sequence. While the contrast agent is present in the subject, first data are acquired from the subject using a first data acquisition technique, as indicated at step 206. In some instances, the first data acquisition can also begin before the contrast agent is administered to the subject, such that some of the first data can be acquired before the contrast agent arrives in the subject's vasculature. In this instance, this pre-contrast data can be viewed as baseline data that may be used in some parameter calculations. The first data are preferably perfusion-weighted data acquired using any suitable DSC-MRI data acquisition technique. Any suitable imaging pulse sequence can be used to obtain this perfusion-weighted data. For instance, perfusion-weighted data can be acquired with a T2*-weighted or T2-weighted pulse sequence during the first pass of the contrast agent. These exams typically run for 90-180 seconds depending on the protocol. As an example, perfusion-weighted data can be acquired using a spin-echo echo-planar imaging ("EPI") pulse sequence or a gradient-echo EPI pulse sequence.

As it is being acquired, the first data (e.g., the perfusion-weighted data) are monitored for a trigger event, as indicated at step 208. When detected, this trigger event will direct the MRI system to switch from the first data acquisition (e.g., the perfusion-weighted data acquisition) to a second data acquisition to acquire second data from the subject. Examples of monitoring for a trigger event are described above. When the trigger event occurs, the MRI system switches to acquiring the second data (e.g., T1-weighted data), as determined at decision block 210. The second data are then acquired while the same single dose of contrast agent is still present in the subject, as indicated at step 212. The second data are preferably T1-weighted data acquired using any suitable DCE-MRI data acquisition technique. Any suitable imaging pulse sequence can be used to obtain this T1-weighted data. For instance, an SPGR sequence can be used to acquire two-dimensional or, preferably, three-dimensional T1-weighted data.

The first data are acquired in step 206 at a first temporal resolution, and the second data acquired in step 208 are acquired at a second temporal resolution that is lower than the first temporal resolution. As one example, the first data can be acquired at a rate of one frame every 1-2 seconds, and the second data can be acquired at a slower rate of one frame every 8-12 seconds.

Figure 3:
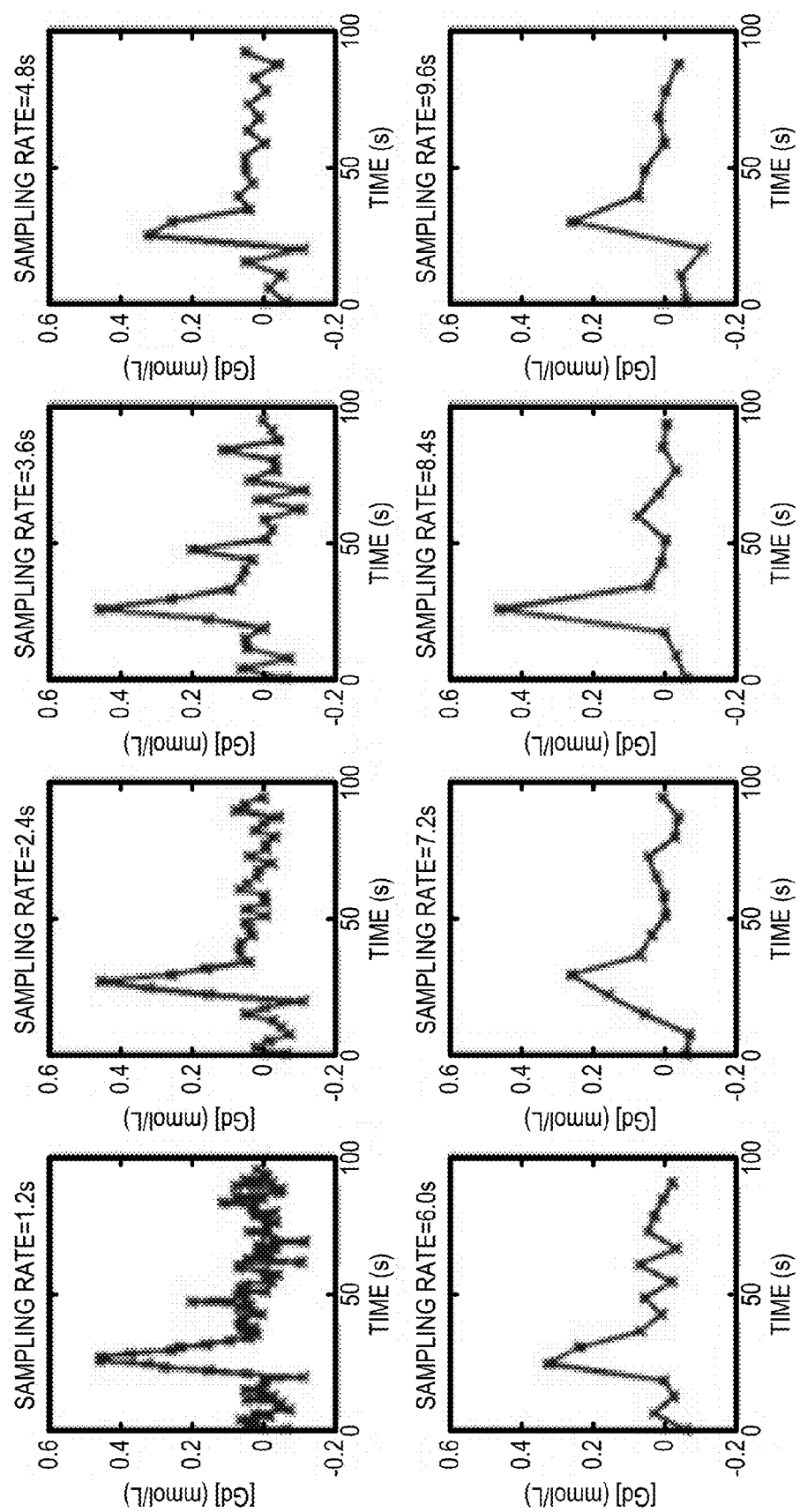
FIG. 3 illustrates an example of an arterial input function ("AIF") computed from data having progressively lower and lower temporal resolution.

Perfusion parameters and tissue permeability parameters can be computed from the perfusion-weighted data and the T1-weighted data. The calculation of these parameters also utilizes an arterial input function ("AIF") computed from the respective data. To compute an AIF accurately, a correct measurement of the concentration of the contrast agent in the blood, as well as the correct shape of its arrival, should be available from the acquired data from which the AIF is computed. When sampling at a slow temporal rate, as in the T1-weighted acquisition, however, both the peak concentration and AIF shape are distorted. An example of this is shown in FIG. 3, in which a signal associated with a contrast agent arrival is shown as being progressively down-sampled to have lower and lower temporal resolution. In this example, it can be seen that the shape of the signal changes (i.e., both its timing and width), as does the peak concentration. All of these parameters are used when trying to fit the different proposed models to estimate permeability parameters, including the exchange rates between the blood and extravascular space to determine the "leakiness" of the blood-brain barrier. Thus, the distortions in the AIF caused by lower temporal resolution will result in less accurate estimations of tissue permeability parameters.

To address this problem, a first AIF is computed from the first data, and a second AIF is computed from the second data. These AIFs can be a global AIFs obtained from a major artery, or local AIFs based on local tissues. Because the temporal resolution of the first data is higher than the second data, the first AIF is more likely to have correct timing, shape, and concentration information than the second AIF. However, the temporal spacing of the second AIF is important for computing tissue permeability parameters from the second data. Thus, the second AIF can be corrected by fitting it to the first AIF. This process maintains the temporal spacing from the second AIF, but retrieves the correct concentration information from the first AIF.

As another approach, a slice timing technique can be implemented to temporally shift, or temporally interpolate, the second data (e.g., the T1-weighted data) to the peak of the signal measured in the first data (e.g., the T2-weighted or T2*-weighted data). Then magnitude difference in the concentration values between these data can then be corrected by scaling the shifted T1-weighted data to match the peak concentration of the AIF computed from the T2-weighted or T2*-weighted data. An example of a slice timing technique that can be implemented in this approach is described by R. Sladky, et al., in "Slice-Timing Effects and Their Correction in Functional MRI," *NeuroImage*, 2011; 58:588-594.

Thus, the method includes computing a first AIF from the first data, as indicated at step 214. The first AIF can then be used to compute a second, corrected AIF from the second data, as indicated at step 216. As described above, in some embodiments the second, corrected AIF is computed by first computing an AIF from the second data and then fitting that AIF to the first AIF to produce the corrected AIF. In some other embodiments, the second, corrected AIF is computed by first temporally shifting, or interpolating, the second data to temporally align with the first AIF. In this latter example, the second, corrected AIF can then be computed from the temporally shifted, or interpolated, data as described above.

In still other embodiments, the contrast concentration information from both sets of acquired data can be combined and used for computing DSC and DCE parameters. For instance, the data can be combined (e.g., by concatenating the two data sets) into a single 4D time series of concentration with different sample intervals resulting from the different imaging acquisition parameters of the DSC (fast) acquisition and the DCE (slow) acquisition. This combined dataset can then be resampled such that the peak concentration of the AIF is captured and the contrast bolus parameters (e.g., width and shape) are properly represented in the analysis of the DCE data. For instance, the DCE data in the combined data set can be temporally interpolated to match the temporal resolution of the DSC data in the combined data set. There may also be a gap between the transition of the DSC data and the DCE data, and this gap can also be temporally interpolated to the temporal resolution of the DSC data. If the spatial resolutions of the two data sets are dissimilar, the DSC data can be spatially interpolated to the same spatial resolution as the DCE data before concatenation. The DSC data can then be processed to calculate the DSC parameters, such as blood flow, blood volume, and mean transit time. The baseline data (e.g., T1 map and T1-weighted signal) in combination with the newly generated concentration time course can be used with models that are known in the art to calculate tissue permeability.

From the perfusion-weighted data and the first AIF, perfusion parameters are computed, as indicated at step 218. These computations can be performed using techniques known in the art. For instance, images can be reconstructed from the perfusion-weighted data and these images can be processed to compute measurements of blood volume, blood flow, and mean transit time. From the baseline data, the T1-weighted data acquired while the contrast agent was present in the subject, and the second, corrected AIF, permeability parameters are computed, as indicated at step 220. These computations can be performed using techniques known in the art. For instance, images can be reconstructed from both the baseline and later-acquired T1-weighted data, from which measurements of tissue permeability can be computed.

The method can also include generating a report of the measured perfusion and permeability of the target tissue, as indicated at step 222. For instance, the generated report can include displaying perfusion maps, permeability maps, or both to a clinician. As another example, the generated report can include presenting one or more a numerical values associated with a perfusion or permeability measurement. As still another example, the generated report can include presenting information to a clinician that is determined on the basis of the perfusion and permeability measurements. For instance, the generated report may indicate a particular tissue or disease state. As another example, the generated report can indicate a tumor response to a particular treatment, or can be used to grade a tumor. As still another example, the generated report can be used to assess the severity of a stroke or the risk for future hemorrhage.

Figure 4:
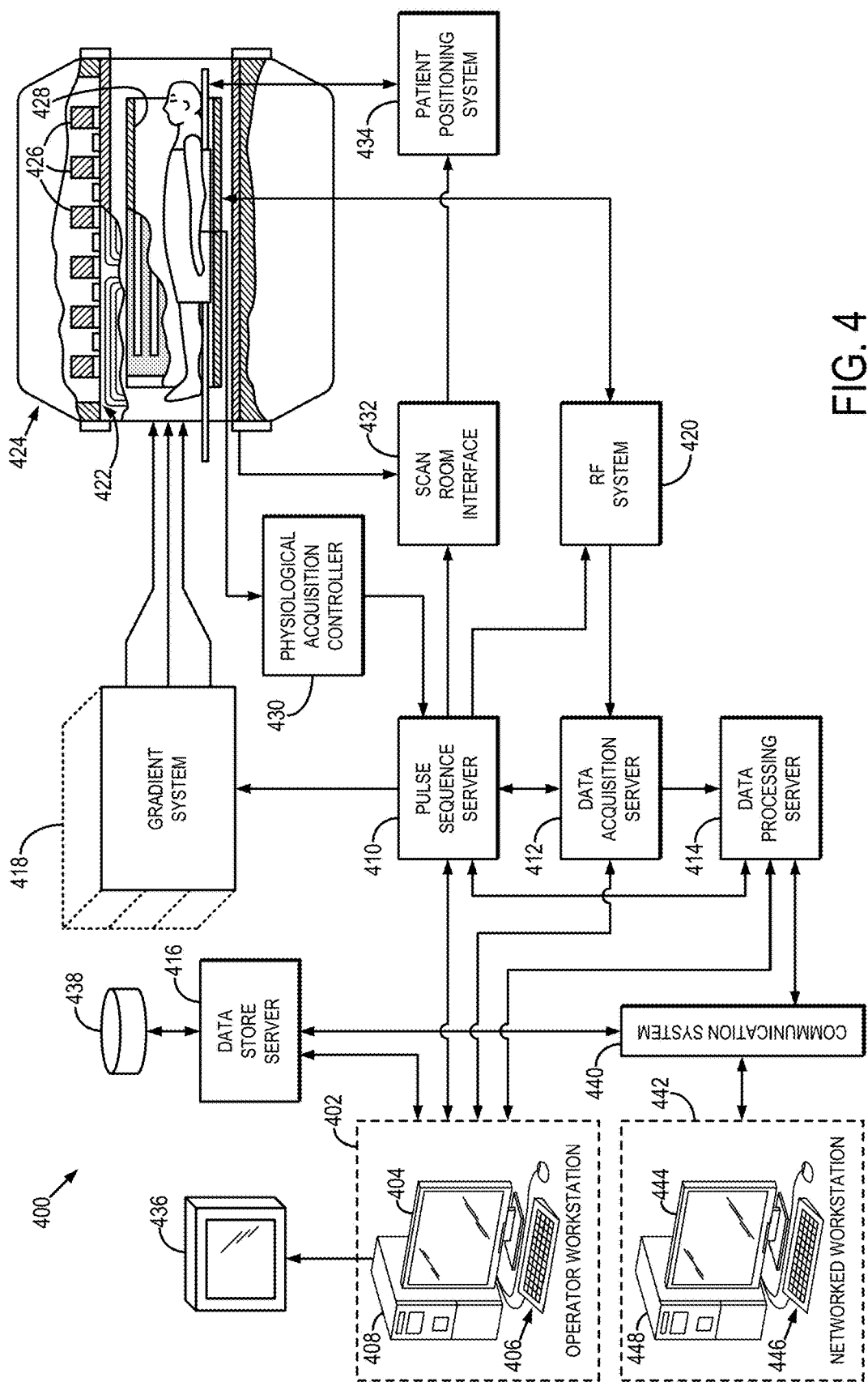
FIG. 4 is a block diagram of an example of a magnetic resonance imaging ("MRI") system.

Referring particularly now to FIG. 4, an example of an MRI system 400 that can implement the methods described here is illustrated. The MRI system 400 includes an operator workstation 402 that may include a display 404, one or more input devices 406 (e.g., a keyboard, a mouse), and a processor 408. The processor 408 may include a commercially available programmable machine running a commercially available operating system. The operator workstation 402 provides an operator interface that facilitates entering scan parameters into the MRI system 400. The operator workstation 402 may be coupled to different servers, including, for example, a pulse sequence server 410, a data acquisition server 412, a data processing server 414, and a data store server 416. The operator workstation 402 and the servers 410, 412, 414, and 416 may be connected via a communication system 440, which may include wired or wireless network connections.

The pulse sequence server 410 functions in response to instructions provided by the operator workstation 402 to operate a gradient system 418 and a radiofrequency ("RF") system 420. Gradient waveforms for performing a prescribed scan are produced and applied to the gradient system 418, which then excites gradient coils in an assembly 422 to produce the magnetic field gradients $G_x$, $G_y$, and $G_z$ that are used for spatially encoding magnetic resonance signals. The gradient coil assembly 422 forms part of a magnet assembly 424 that includes a polarizing magnet 426 and a whole-body RF coil 428.

RF waveforms are applied by the RF system 420 to the RF coil 428, or a separate local coil to perform the prescribed magnetic resonance pulse sequence. Responsive magnetic resonance signals detected by the RF coil 428, or a separate local coil, are received by the RF system 420. The responsive magnetic resonance signals may be amplified, demodulated, filtered, and digitized under direction of commands produced by the pulse sequence server 410. The RF system 420 includes an RF transmitter for producing a wide variety of RF pulses used in MRI pulse sequences. The RF transmitter is responsive to the prescribed scan and direction from the pulse sequence server 410 to produce RF pulses of the desired frequency, phase, and pulse amplitude waveform. The generated RF pulses may be applied to the whole-body RF coil 428 or to one or more local coils or coil arrays.

The RF system 420 also includes one or more RF receiver channels. An RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 410 may receive patient data from a physiological acquisition controller 430. By way of example, the physiological acquisition controller 430 may receive signals from a number of different sensors connected to the patient, including electrocardiograph ("ECG") signals from electrodes, or respiratory signals from a respiratory bellows or other respiratory monitoring devices. These signals may be used by the pulse sequence server 410 to synchronize, or "gate," the performance of the scan with the subject's heart beat or respiration.

The pulse sequence server 410 may also connect to a scan room interface circuit 432 that receives signals from various sensors associated with the condition of the patient and the magnet system. Through the scan room interface circuit 432, a patient positioning system 434 can receive commands to move the patient to desired positions during the scan.

The digitized magnetic resonance signal samples produced by the RF system 420 are received by the data acquisition server 412. The data acquisition server 412 operates in response to instructions downloaded from the operator workstation 402 to receive the real-time magnetic resonance data and provide buffer storage, so that data is not lost by data overrun. In some scans, the data acquisition server 412 passes the acquired magnetic resonance data to the data processor server 414. In scans that require information derived from acquired magnetic resonance data to control the further performance of the scan, the data acquisition server 412 may be programmed to produce such information and convey it to the pulse sequence server 410. For example, during pre-scans, magnetic resonance data may be acquired and used to calibrate the pulse sequence performed by the pulse sequence server 410. As another example, navigator signals may be acquired and used to adjust the operating parameters of the RF system 420 or the gradient system 418, or to control the view order in which k-space is sampled. In still another example, the data acquisition server 412 may also process magnetic resonance signals used to detect the arrival of a contrast agent in a magnetic resonance angiography ("MRA") scan. For example, the data acquisition server 412 may acquire magnetic resonance data and processes it in real-time to produce information that is used to control the scan.

The data processing server 414 receives magnetic resonance data from the data acquisition server 412 and processes the magnetic resonance data in accordance with instructions provided by the operator workstation 402. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 414 are conveyed back to the operator workstation 402 for storage. Real-time images may be stored in a data base memory cache, from which they may be output to operator display 402 or a display 436. Batch mode images or selected real time images may be stored in a host database on disc storage 438. When such images have been reconstructed and transferred to storage, the data processing server 414 may notify the data store server 416 on the operator workstation 402. The operator workstation 402 may be used by an operator to archive the images, produce films, or send the images via a network to other facilities.

The MRI system 400 may also include one or more networked workstations 442. For example, a networked workstation 442 may include a display 444, one or more input devices 446 (e.g., a keyboard, a mouse), and a processor 448. The networked workstation 442 may be located within the same facility as the operator workstation 402, or in a different facility, such as a different healthcare institution or clinic.

The networked workstation 442 may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may be exchanged between the data processing server 414 or the data store server 416 and the networked workstations 442, such that the data or images may be remotely processed by a networked workstation 442.

The present disclosure has described one or more preferred embodiments, and it should be appreciated that many equivalents, alternatives, variations, and modifications, aside from those expressly stated, are possible and within the scope of the invention.

The invention claimed is:

1. A method for directing a magnetic resonance imaging (MRI) system to acquire T2-weighted data and T1-weighted data from a subject in which a single dose of contrast agent is present, the steps comprising:
   (a) administering a dose of a contrast agent to the subject;
   (b) directing the MRI system to acquire T2-weighted data from the subject while the dose of contrast agent is present in the subject, wherein the T2-*-weighted data are acquired at a first temporal resolution;
   (c) monitoring signal values in the T2-weighted data for a trigger event while the MRI system is acquiring the T2-weighted data;
   (d) directing the MRI system to acquire T1-weighted data from the subject while the dose of contrast agent is present in the subject by switching from a T2-weighted pulse sequence to a T1-weighted pulse sequence when the trigger event occurs, wherein the T1-weighted data are acquired at a second temporal resolution that is lower than the first temporal resolution;
   (e) computing a first arterial input function (AIF) from the T2-weighted data;
   (f) computing a second AIF from the T1-weighted data, wherein the second AIF is corrected for the second temporal resolution being lower than the first temporal resolution;
   (g) computing perfusion parameters using the first AIF; and
   (h) computing tissue permeability parameters using the second AIF.

2. The method as recited in claim 1, wherein the second AIF is a corrected AIF that is computed by first computing an AIF from the T1-weighted data and then fitting that AIF to the first AIF to generate the corrected AIF that has a same temporal spacing as the T1-weighted data but corrected concentration values from the first AIF.

3. The method as recited in claim 1, wherein the second AIF is a corrected AIF that is computed by first temporally shifting the T1-weighted data based on the first AIF and computing the corrected AIF from the temporally shifted T1-weighted data.

4. The method as recited in claim 3, wherein a magnitude of the temporally shifted data is scaled based on contrast agent concentration values indicative of the first AIF before computing the corrected AIF.

5. The method as recited in claim 1, wherein the trigger event comprises monitoring the signal values for a peak negative signal value and then monitoring the signal values for a recovery to a stable signal value, whereby when the recovery to the stable signal occurs the MRI system switches from the T2-weighted pulse sequence to the T1-weighted pulse sequence.

6. The method as recited in claim 1, wherein the trigger event comprises monitoring the signal values for a peak negative signal value, then monitoring the signal values for a recovery to a percent of a baseline signal value, and then waiting a delay time after the recovery to the percent of the baseline is detected, whereby the MRI system switches from the T2-weighted pulse sequence to the T1-weighted pulse sequence after the delay time.

7. The method as recited in claim 6, wherein the delay time is in a range of about 3 to 9 seconds.

8. The method as recited in claim 1, wherein the trigger event comprises monitoring the signal values for a peak negative signal value and then waiting a delay time after the peak negative value is detected, whereby the MRI system switches from the T2-weighted pulse sequence to the T1-weighted pulse sequence after the delay time.

9. The method as recited in claim 8, wherein step c) includes measuring a time during which the signal values decrease from a baseline signal value to the peak negative value and setting the delay time as twice the time taken for the signal values decrease from the baseline signal value to the peak negative value.

10. The method as recited in claim 8, wherein the delay time is in a range of about 7 to 15 seconds.

11. The method as recited in claim 1, wherein the trigger event comprises monitoring the signal values for a percent decrease from a baseline signal value and then waiting a delay time after the percent decrease from the baseline signal value is detected, whereby the MRI system switches from the T2-weighted pulse sequence to the T1-weighted pulse sequence after the delay time.

12. The method as recited in claim 11, wherein the delay time is in a range of about 12 to 25 seconds.

13. The method as recited in claim 1, wherein monitoring the signal values in step c) comprises monitoring signal values in a selected region-of-interest.

14. The method as recited in claim 13, wherein the region-of-interest is a slice location within an image volume from which the T2-weighted data is acquired.

15. The method as recited in claim 14, wherein the region-of-interest is a subset of a slice location within an image volume from which the T2-weighted data is acquired.

16. The method as recited in claim 14, wherein the region-of-interest is a subvolume of an image volume from which the T2-weighted data is acquired.

17. The method as recited in claim 14, wherein the region-of-interest is an entire image volume from which the T2-weighted data is acquired.

18. The method as recited in claim 14, wherein the region-of-interest is located outside of an image volume from which the T2-weighted data is acquired and step c) comprises acquiring additional T2-weighted data from the region-of-interest.

19. The method as recited in claim 1, wherein step (h) further comprises providing baseline T1-weighted data acquired from the subject and computing the tissue permeability parameters from the baseline T1-weighted data and the T1-weighted data using the second AIF.

20. The method as recited in claim 1, further comprising generating a report using the computed perfusion parameters and the computed tissue permeability parameters.

21. The method as recited in claim 20, wherein the generated report includes at least one of an image indicating the computed perfusion parameters and an image indicating the computed tissue permeability measurements.

22. The method as recited in claim 1, wherein the T2-weighted data are T2*-weighted data.

23. A method for directing a magnetic resonance imaging (MRI) system to acquire T2-weighted data and T1-weighted data from a subject in which a single dose of contrast agent is present, the steps comprising:
   (a) administering a dose of a contrast agent to the subject;

(b) directing the MRI system to acquire T2-weighted data from the subject while the dose of contrast agent is present in the subject, wherein the T2-weighted data are acquired at a first temporal resolution;
(c) monitoring signal values in the T2-weighted data for a trigger event while the MRI system is acquiring the T2-weighted data;
(d) directing the MRI system to acquire T1-weighted data from the subject while the dose of contrast agent is present in the subject by switching from a T2-weighted pulse sequence to a T1-weighted pulse sequence when the trigger event occurs, wherein the T1-weighted data are acquired at a second temporal resolution that is lower than the first temporal resolution;
(e) generating generalized concentration time course data by concatenating the T2-weighted data and the T1-weighted data, wherein the generalized concentration time course data have varied temporal sampling intervals based on the first temporal resolution and the second temporal resolution;
(f) temporally interpolating the generalized concentration time course data to a common temporal resolution;
(g) computing perfusion parameters from the T2-weighted data; and
(h) computing tissue permeability parameters from the generalized concentration time course data.

\* \* \* \* \*